United States Patent [19]

Smith, III

[11] Patent Number: 4,812,886
[45] Date of Patent: Mar. 14, 1989

[54] MULTILAYER CONTACT APPARATUS AND METHOD

[75] Inventor: Theoren P. Smith, III, Yorktown Heights, N.Y.

[73] Assignee: International Business Machines Corporation, Armonk, N.Y.

[21] Appl. No.: 12,575

[22] Filed: Feb. 9, 1987

[51] Int. Cl.$^4$ .............................................. H01L 29/80
[52] U.S. Cl. .......................................... 357/22; 357/16
[58] Field of Search ...................... 355/22 A, 16, 22 J, 355/22 E, 22 I

[56] References Cited

U.S. PATENT DOCUMENTS

| | | | |
|---|---|---|---|
| 4,424,525 | 1/1984 | Mimura | 357/22 A |
| 4,455,564 | 6/1984 | Delagebeaudeuf et al. | 357/22 |
| 4,471,367 | 9/1984 | Chen et al. | 357/22 |
| 4,558,337 | 12/1985 | Loumier | 357/22 A |

FOREIGN PATENT DOCUMENTS

| | | |
|---|---|---|
| 134998 | 2/1982 | Japan . |
| 173897 | 5/1982 | Japan . |

OTHER PUBLICATIONS

Bonnefoi, et al., *Resonant Tunneling Transistors with Controllable Negative Differential Resistance*, IEEE Electron Device Letters, vol. 6, No. 12, Dec. 1985.
N. Cirillo, et al., *Self-Aligned Modulation-Doped (Al,Ga) As/GaAs Field Effect Transistors*, Electron Device Letters.
R. Thorne, et al., *Performance of Inverted Structure Modulation Doped Schottky Barrier Field Effect Transistors*, Japanese Journal of Applied Physics, vol. 21, No. 4, Apr. 1982.
Woodward, et al., *Experimental Realization of a Resonant Tunneling Transistor*, General Physics Advance Abstracts, vol. 3, No. 3, Feb. 1987.
S. Long, et al., *High Speed GaAs Integrated Circuits*, IEEE Proceedings, vol. 70, No. 1, Jan. 1982.
R. Fischer, et al., *New High-Speed (Al/Ga) As Modulation Doped Field-Effect Transistors*, IEEE Circuits and Devices Magazine, Jul. 1985.
S. Lee, et al., *Parasitic Source and Drain Resistance in High-Electron-Mobility Transistors*, Solid-State Electronics, vol. 28, No. 7, 1985.

*Primary Examiner*—Martin H. Edlow
*Attorney, Agent, or Firm*—Scully, Scott, Murphy & Presser

[57] ABSTRACT

A multilayer contact is shown in a heterojunction device. One contact extends through two or more vertical, conducting layers. Two contacts deposited on a common surface. Each contact separately bias different layers beneath the surface. A Schottky barrier between the contacts establishes a depletion region that electrically controls the current flow path between the contacts.

12 Claims, 1 Drawing Sheet

4,812,886

MULTILAYER CONTACT APPARATUS AND METHOD

The U.S. government has rights in this invention pursuant to Contract No. DAAG29-81-C-0038 awarded by the U.S. Army Research Office.

BACKGROUND OF THE INVENTION

This invention relates to semiconductor devices and, in particular, to a semiconductor device with a multilayer contact and a method for making such an apparatus.

Semiconductor devices, such as transistors, can consist of multiple layers of semiconducting or insulating materials. In a vertical transistor there are at least three layers including an emitter, base and collector. Charge carriers, either holes or electrons or both, pass from the emitter, through the base, to the collector. A metallic contact is deposited on each of the layers for operating the transistor.

Horizontal or field effect transistor are also multilayer devices. The source, gate and drain each have a metallic contact on a common, upper surface. The gate may include a Schottky barrier that creates a depletion layer to control the transfer of charges that flow underneath the gate from the source to the drain.

Recent developments in semiconductors have produced multilayer heterojunction devices. These devices, either vertical or horizontal transistors, are typically fashioned from alternate layers of gallium arsenide (Ga As) and aluminum gallium arsenide (Al Ga As). Under voltages suitably applied to such a device, a thin, high mobility region is formed at the junction of such materials. This region, in a horizontal transistor, is termed a two dimensional electron gas or 2 DEG. Electrons that enter a 2DEG can move very quickly. Such quick motion gives such transistors a switching speed almost four-times as fast as other transistors.

In horizontal high mobility devices, such as field effect transistors, it is known to place a source and drain contact on a common upper surface. A Schottky barrier, as a gate, is positioned between the source and drain and on the upper surface. The gate controls the flow of charges in the 2 DEG between the source and drain by depleting the 2 DEG beneath the gate electrode. See, for example, U.S. Pat. Nos. 4,558,337; 4,471,367 and 4,455,564. The source and drain contacts are both on the upper layer and do not extend to other layers.

Vertical high mobility devices are more difficult to fabricate. They comprise very thin layers that have to be precisely deposited or etched to expose lower layers for forming ohmic contacts. Two hundred angstroms is typical of the thickness of some layers. Molecular beam epitaxial deposition equipment can deposit such thin layers. However, it is difficult to fix metal contacts on devices with such thin layers. Moreover, it is desirable in some applications e.g. oscillators, to switch the conduction path between different layers. As such, it would be desirable to have a device with a metallic contact selectively connectable to two or more layers, i.e. a multilayer contact. Such a contact could extend from an upper surface through to a desired lower layer. Such a contact would reduce the need for precise etching of intermdiate, thin layers to expose the contact layer for receiving the metal contact.

SUMMARY OF THE INVENTION

The invention provides an apparatus and a method for independently contacting various layers of a device with a single common contact. A first high conductivity region or contact extends through the surface of the device to a lower layer of the device. A second high conductivity region or contact is separated from the first region or contact and extends from the surface of the device to another layer adjacent the surface. A carrier depletion control means, such as a Schottky barrier is deposited on the surface of the device between the first and second high conductivity regions or contacts. The control means operates to deplete carriers from a region between the two contacts and thereby control the conductivity of part of one layer so that two layers may be contacted independently to provide independent paths for the flow of current between the contacts. Hence, separate contacts are provided for two vertically separate layers without the need for providing a separate insulating material on the surface layer between the contacts or for physically removing material from the upper layer to expose the lower layer for receiving a metallic contact. As such, the invention is especially useful in vertical, heterojunction, single carrier devices such as ballistic or tunneling hot electron transfer amplifier (THETA) devices. Electrical contact to various layers is maintained even though the layers are as thin as 200 Å. Such a technique could be used to further reduce the overall dimensions of a device since thin layers of 200 Å or less can be used to separate conductors. The invention could further the development of a three-dimensional or stacked microprocessor since interlayer metallic contact is feasible.

DETAILED DESCRIPTION OF THE INVENTION

Figure 1:
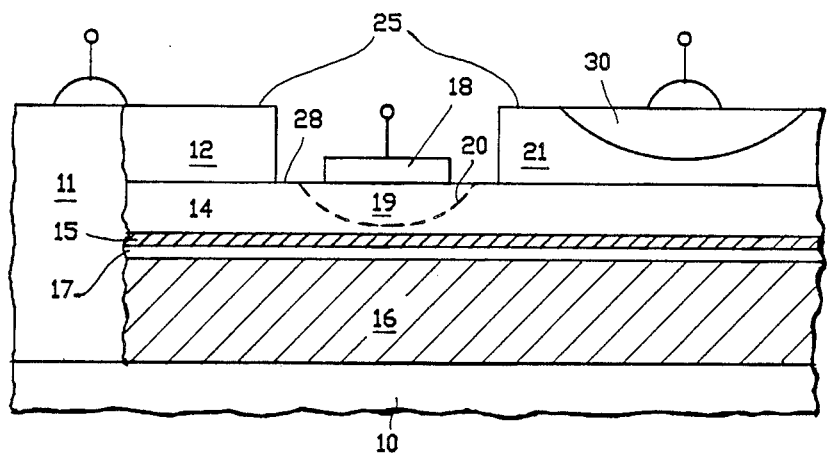
FIG. 1 is a cross-sectional view of one preferred embodiment of the invention.

A structure 10 in FIG. 1 generally shows the features of the invention. A first region of high conductivity or a metallic alloy contact 11 extends through an electrode 12 and conductive layer 14 through a barrier layer 15, and into a conducting layer 17. A second region of high conductivity or metallic alloy contact 30 extends into an upper electrode 21 deposited on conductive layer 14.

Electrodes 12 and 21 are formed of n+doped Ga As. Each electrode 12, 21 is approximately 2000Å thick and its doping is $5 \times 10^{18}/cm^3$. Electrodes 12, 21 extend from a common upper surface 25 to conductive layer 14. Layer 14 lies underneath electrodes 12, 21 and comprises approximately 1000Å of Ga As doped n− in the order of $1 \times 10^{17}/cm^3$. Beneath layer 14 is layer 15, a barrier layer separating conducting layers 14 and 17. It is shown as a 200Å layer of Al Ga As. The lower conducting layer, layer 16 is a 2000Å layer of modulation doped Al Ga As. Due to the alignment of the conduction bands of GaAs and Al Ga As at the heterojunction between layers 17 and 16 a high mobility 2 DEG 17 is formed in layer 17. However, if a 2 DEG is not required, layer 17 could be a heavily doped layer of GaAs and layer 16 could be omitted or replaced by undoped Al Ga As.

A depletion control means comprising a Schottky barrier electrode 18 is deposited on upper surface 28 of layer 14 between electrodes 12 and 21. When suitably biased, the depletion control electrode 18 generates a depletion region 19 in layer 14. The boundary of depletion region 19 is shown by dashed line 20. By adjusting the bias voltage applied to electrode 18, the boundary 20 can be extended to layer 15, thereby effectively electrically isolating the portion of layer 14 that underlies electrode 12 from the rest of layer 14. In this manner, contact 11 is isolated electrically from contact 30 in layer 14 while being electrically connected through layer 17.

The device 10, thus have a two-layer contact 11 that is in contact with a lower layer 17 and selectively connectable to electrode 21 through layer 14 or 17. Hence, a bias of one voltage can be applied to electrode 21 and a bias of another voltage can be applied to electrode 18. Electrode 21 and the underlying portion of layer 14 can be kept electrically isolated from electrode 12 by a suitable control voltage imposed on control electrode 18. Alternatively, the electrode 21 and electrode 12 can be electrically connected by altering the voltage on control electrode 18 to reduce the depletion region 19. Thus, a lower layer 17 can be contacted independently from the contacting of upper layer 14 without precision etching of upper layer 14 and layer 15 to expose layer 17.

The structure of FIG. 1, in operation, can be used to provide an output of ohmic characteristic or the characteristic determined by layers 15, 16 and 17. For zero bias voltage on electrode 18, current will flow between contacts 11 and 30 through layer 14 in accordance with the simple formula of V=IR. The resistance, R, can be effectively increased by applying a bias voltage to electrode 18. However, when the depletion region expands to layer 15, normal ohmic current will be cut off. Thereafter, the I/V characteristic of the device will be different. It may have a negative resistive characteristic. That characteristic will depend upon the materials comprising layers 15, 16 and 17 and the effects of the 2DEG layer. Such a dual characteristics device is especially useful to fabricate oscillators.

Figure 2:
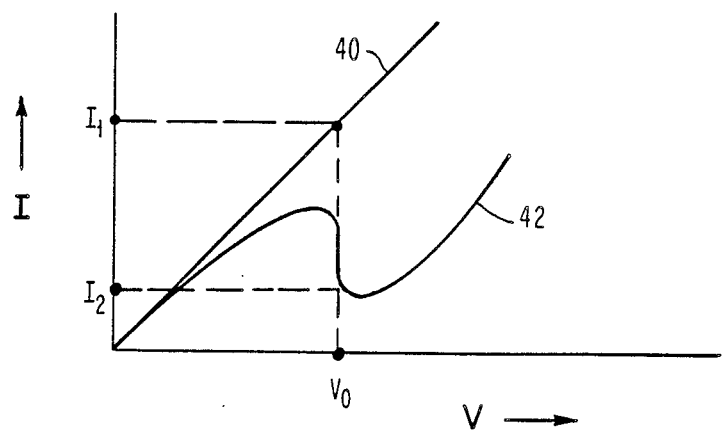
FIG. 2 is a graph of the voltage and current characteristics of a structure of the invention.

Such a dual characteristic is shown in FIG. 2, where I is current between contacts 11, 30 and V is the voltage between those contacts. Two curves, or characteristics, 40, 42 are shown. When the bias voltage on electrode 18 is below a threshold value, the device of structure 10 will demonstrate an ohmic characteristic, 40. Past the threshold value, the depletion region 19 electrically isolates electrodes 12 and 21 in layer 14, and a second characteristic 42 is demonstrated for current flow through layer 17. Such a dual characteristic device is useful as an amplifier or an oscillator since it has two discrete valves ($I_1$, $I_2$) as a function of the bias on electrode for a given voltage ($V_0$).

Those skilled in the art will appreciate that the invention makes possible the separation of active layers with a common electrical contact. Such a feature could be used to further reduce the size of a semiconductor device since separation may be made by means of a thin molecular epitaxially deposited layers.

What is claimed is:

1. A semiconductor structure having a plurality of superimposed layers essentially parallel to an exposed surface having a separate ohmic contact to adjacent layers containing charge carriers comprising in combination:

a first high conductivity region extending through said surface to a conducting lower one of said layers, with respect to said surface.

a second high conductivity region separated from said first high conductivity region extending through said surface to a conducting upper layer adjacent said surface, and carrier depletion control means positioned on said surface between said high conductivity regions and operable to deplete said upper layer of carriers whereby the lower layer and the upper layer are separately contacted between said first and second high conductivity regions.

2. The semiconductor structure of claim 1 wherein said first and second high conductivity regions comprise first and second metallic alloy contacts.

3. The semiconductor structure of claim 2 wherein said first metallic contact is in electrical contact with said lower layer and said second metallic contact is in electrical contact with said layer adjacent the surface.

4. The semiconductor struction of claim 1 wherein said barrier depletion control means comprises a Schottky barrier.

5. The semiconductor structure of claim 4 wherein said Schottky barrier comprises a metallic electrode deposited on said surface and adapted to receive a bias voltage.

6. A semiconductor structure comprising an AlGaAs modulation doped substrate, a layer of undoped GaAs epitaxially deposited on said substrate for generating a 2 DEG layer in said undoped epitaxial layer, a layer of undoped AlGaAs, a layer of doped GaAs epitaxially deposited on said undoped AlGaAs layer;

a first metallic alloyed contact extending through the surface of said doped GaAs layer to said substrate and in electrical contact with the doped GaAs layer and the substrate layer; a second alloyed metallic contact, laterally spaced from the first contact and is in electrical contact with said doped GaAs layer; an electrode on the surface of said GaAs layer, said electrode positioned between the two alloyed metallic contacts for depleting charge carriers beneath the electrode when a voltage is applied to said electrode whereby independent contact is made to the substrate and the GaAs layers.

7. The semiconductor structure of claim 6 wherein the doped GaAs is n-doped.

8. The semiconductor structure of claim 6 wherein the doped GaAs is p-doped.

9. A method for separately electrically contacting each of two superimposed charge carrying layers essentially parallel to an exposed surface comprising the steps of:

contacting a lower one of said layers with a first high conductivity region extending through said surface to said lower one of said layers, with respect to said surface, contacting an upper layer adjacent said surface with a second high conductivity region separated from said first high conductivity region and extending through said surface to said upper layer adjacent said surface, and controlling carrier depletion between said high conductivity regions by selectively depleting said upper layer of charge carriers whereby the lower layer and the upper layer are separately contacted.

10. The semiconductor contacting process of claim 9 wherein said first and second high conductivity regions comprise first and second metallic alloy contacts.

11. The semiconductor contacting process of claim 10 wherein said first metallic contact is in electrical contact with said lower layer and said second metallic contact is in electrical contact with said layer adjacent the surface.

12. The semiconductor contacting process of claim 9 wherein said carrier depletion is controlled with a Schottky barrier.